(12) United States Patent
Khorram

(10) Patent No.: US 7,079,818 B2
(45) Date of Patent: Jul. 18, 2006

(54) PROGRAMMABLE MUTLISTAGE AMPLIFIER AND RADIO APPLICATIONS THEREOF

(75) Inventor: Shahla Khorram, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 911 days.

(21) Appl. No.: 10/074,572

(22) Filed: Feb. 12, 2002

(65) Prior Publication Data

US 2003/0152163 A1 Aug. 14, 2003

(51) Int. Cl.
*H04B 17/00* (2006.01)
*H04B 1/04* (2006.01)
*G01R 19/00* (2006.01)
*H03F 1/24* (2006.01)

(52) U.S. Cl. .............. 455/115.1; 455/115.2; 455/127.3; 455/114.4; 455/67.14; 455/68; 330/2; 330/96; 330/98

(58) Field of Classification Search ............ 455/115.1, 455/115.2, 115.3, 114.3, 114.4, 126, 127.2, 455/127.3, 67.11, 68, 67.14, 69, 240.1, 241.1, 455/245.2, 251.1; 330/2, 96–99
See application file for complete search history.

(56) References Cited

U.S. PATENT DOCUMENTS

| | | | | |
|---|---|---|---|---|
| 4,857,865 A | * | 8/1989 | Berman et al. ............. | 330/304 |
| 5,126,688 A | * | 6/1992 | Nakanishi et al. .......... | 330/285 |
| 5,347,222 A | * | 9/1994 | Fox et al. ................... | 324/322 |
| 5,369,789 A | * | 11/1994 | Kosugi et al. .............. | 455/126 |
| 5,507,017 A | * | 4/1996 | Whitmarsh et al. ......... | 455/126 |
| 5,852,770 A | * | 12/1998 | Kasamatsu .................. | 455/126 |
| 5,933,767 A | * | 8/1999 | Leizerovich et al. ........ | 455/126 |
| 6,256,483 B1 | * | 7/2001 | Moerder et al. ......... | 455/115.1 |
| 6,393,372 B1 | * | 5/2002 | Rzyski ....................... | 702/111 |
| 6,418,301 B1 | * | 7/2002 | Le et al. ....................... | 455/73 |
| 6,580,901 B1 | * | 6/2003 | Mochizuki ............... | 455/127.1 |
| 6,650,875 B1 | * | 11/2003 | Rozenblit et al. ............. | 455/91 |
| 6,725,021 B1 | * | 4/2004 | Anderson et al. ........ | 455/115.1 |
| 6,819,938 B1 | * | 11/2004 | Sahota ....................... | 455/522 |
| 6,876,697 B1 | * | 4/2005 | Peters et al. ................ | 375/222 |
| 2002/0086651 A1 | * | 7/2002 | Prentice et al. .......... | 455/234.1 |
| 2002/0193078 A1 | * | 12/2002 | MacFarlane Shearer, III et al. ........................... | 455/69 |

\* cited by examiner

*Primary Examiner*—Duc M. Nguyen
(74) *Attorney, Agent, or Firm*—Garlick Harrison & Markison; Timothy W. Markison

(57) ABSTRACT

A programmable multi-stage amplifier includes a $1^{st}$ programmable amplifier, a $2^{nd}$ programmable amplifier, and a control module. The $1^{st}$ and $2^{nd}$ programmable amplifiers are coupled in series to amplify an input signal. Each of the $1^{st}$ and $2^{nd}$ programmable amplifiers is operably coupled to receive independent gain control signals from the control module. The control module generates the gain control signals by determining the overall gain desired for the programmable multi-stage amplifier and a corresponding gain for each of the $1^{st}$ and $2^{nd}$ programmable amplifiers. The factors in which the control module makes this determination are based on an optimization of at least one of the power level of the programmable multi-stage amplifier, the noise factor for the programmable multi-stage amplifier, and/or linearity of the programmable multi-stage amplifier.

18 Claims, 9 Drawing Sheets transmitter 100 transmitter 210 highly linear power amplifier 212

US 7,079,818 B2

PROGRAMMABLE MUTLISTAGE AMPLIFIER AND RADIO APPLICATIONS THEREOF

TECHNICAL FIELD OF THE INVENTION

This invention relates generally to communication systems and more particularly to radio transceivers used within such communication systems.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), wireless application protocols (WAP), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel (e.g., one of the plurality of radio frequency (RF) carriers of the wireless communication system) and share information over that channel. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals via one or more intermediate frequency stages, and demodulates the signals in accordance with a particular wireless communication standard to recapture the transmitted data. The transmitter converts data into RF signals by modulating the data in accordance with the particular wireless communication standard and adds an RF carrier to the modulated data in one or more intermediate frequency stages to produce the RF signals.

As the demand for enhanced performance (e.g., reduced interference and/or noise, improved quality of service, compliance with multiple standards, increased broadband applications, et cetera), smaller sizes, lower power consumption, and reduced costs increases, wireless communication device engineers are faced with a very difficult design challenge to develop such a wireless communication device. Typically, an engineer is forced to compromise one or more of these demands to adequately meet the others. For instance, an engineer may choose a direct conversion topology (i.e., convert directly from an RF signal to a base-band signal or directly from a base-band signal to an RF signal) to meet size requirements and/or broadband application requirements. However, for direct conversion transceivers, noise and/or interference increases due to local oscillation leakage, non-linearities due to component mismatches and/or process variations are more detrimental to overall performance, and DC offsets, which result from a slight offset between the transmitting frequency of one wireless communication device and the frequency of the receiver in another wireless communication device, are more pronounced.

As is known, local oscillation leakage results from imperfections of the mixers within a transmitter that allow the local oscillation, which equals the RF, to be present in the resultant RF signal. The local oscillation leakage can be minimized by using multiple IF stages within the transmitter. In such an implementation, each IF stage uses a local oscillation that has a significantly different frequency than the RF, with the sum of the multiple local oscillations equals the RF. Since each local oscillation has a significantly different frequency than the RF, each local oscillation is outside the RF band of interest (i.e., the frequency spectrum of the resulting RF signal). But this requires an abandoning of the direct conversion topology and its benefits with respect to size reduction, power consumption reduction, reduced costs, and reduced complexity for broadband applications.

Costs of manufacturing a radio frequency integrated circuit (IC) may be reduced by switching from one integrated circuit manufacturing process to another. For example, a CMOS process may be used instead of a bi-CMOS process since it is a more cost affective method of IC manufacture, but the CMOS process increases component mismatches, increases temperature related variations, and increases process variations. As such, noise, local oscillator leakage, non-linearities and other factors that negatively impact an RF IC performance are increased for a CMOS process. Thus, in many RF IC applications, a designer chooses between cost savings and performance.

As is further known, many wireless communication standards provide for varying the transmitting power of the transmitter based on received signal strength of the wireless communication device receiving the transmission to conserve power. For instance, if the received RF signal is very strong, the receiver can easily recapture the embedded data. In such an instance, the transmission power level of the transmitter can be reduced and still provide a sufficiently strong RF signal to enable the receiver accurately recover the embedded data. Conversely, when the received signal is too weak, the receiver cannot accurately recover the embedded data, thus the transmission power level needs to be increased. Typically, the transmitter power is increased by increasing the gain of its power amplifier. The gain of the power amplifier is increased by changing the bias level of the input signal. While this increases the gain, the linearity of the power amplifier is adversely affected, which adversely affects the performance of the transmitter and the overall radio.

Therefore, a need exists for a low power, reduced size, reduced cost, and enhanced performance radio, radio transmitter, radio receiver, and/or components thereof.

SUMMARY OF THE INVENTION

These needs and others are substantially met by the programmable multi-stage amplifier and radio applications thereof disclosed herein. In one embodiment, the programmable multi-stage amplifier includes a $1^{st}$ programmable amplifier, a $2^{nd}$ programmable amplifier, and a control module. The $1^{st}$ and $2^{nd}$ programmable amplifiers are coupled in series to amplify an input signal. Each of the $1^{st}$ and $2^{nd}$ programmable amplifiers is operably coupled to receive independent gain control signals from the control module. The control module generates the gain control signals by determining the overall desired gain for the programmable multi-stage amplifier and a corresponding gain for each of the $1^{st}$ and $2^{nd}$ programmable amplifiers. The factors in which the control module makes this determination are based on an optimization of at least one of the power level of the programmable multi-stage amplifier, the noise factor for the programmable multi-stage amplifier, and/or linearity of the programmable multi-stage amplifier.

The programmable multi-stage amplifier may be incorporated into a radio transmitter, which may be a stand-alone device and/or incorporated into a radio. By incorporating a multi-stage amplifier in a transmitter and/or radio, linearity, noise level and/or power levels may be improved for the transmitter and thus improve for the overall radio.

DETAIL DESCRIPTION OF A PREFERRED EMBODIMENT

Figure 1:
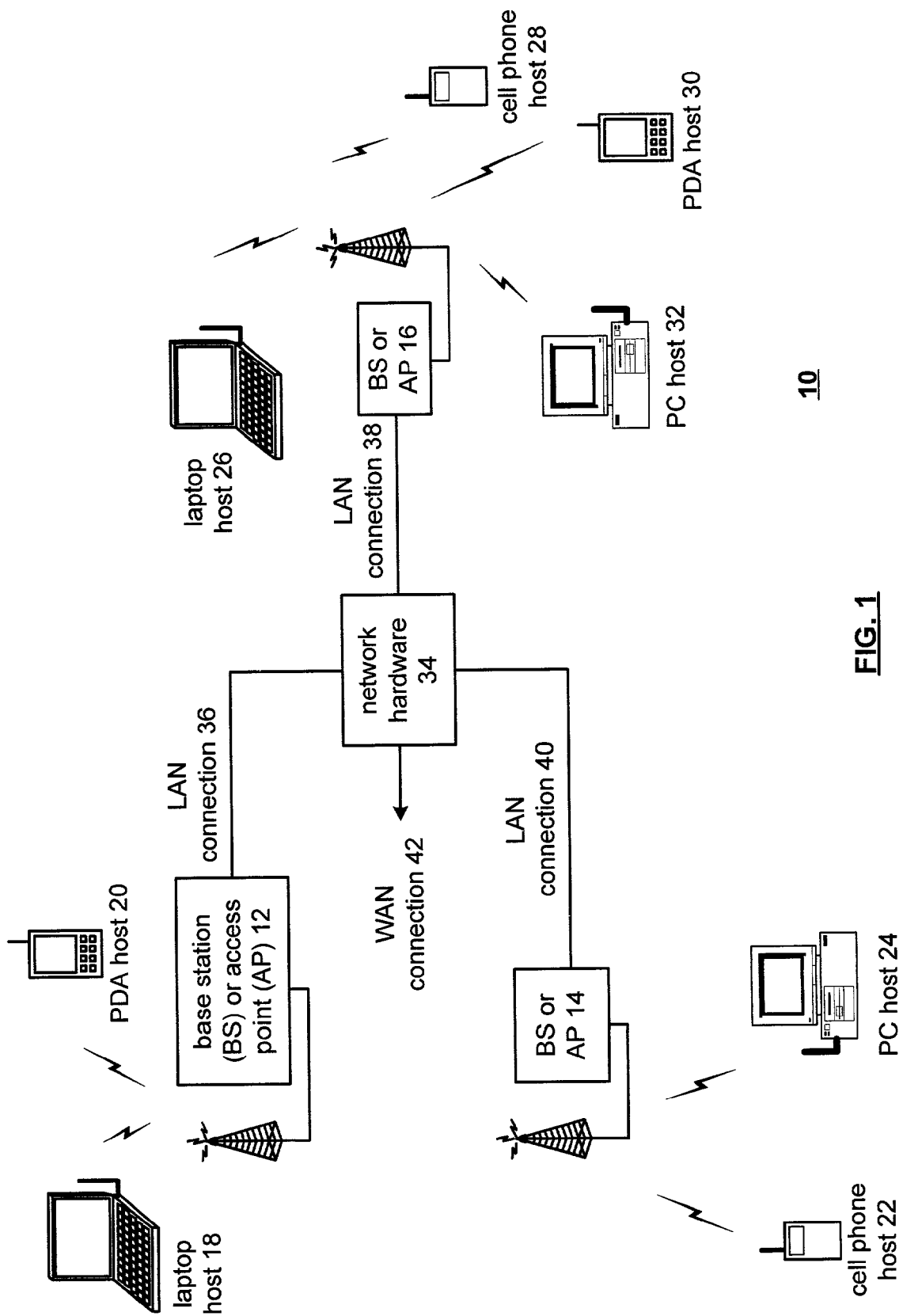
FIG. 1 illustrates a schematic block diagram of a communication system that supports wireless communication devices in accordance with the present invention.

FIG. 1 illustrates a schematic block diagram of a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
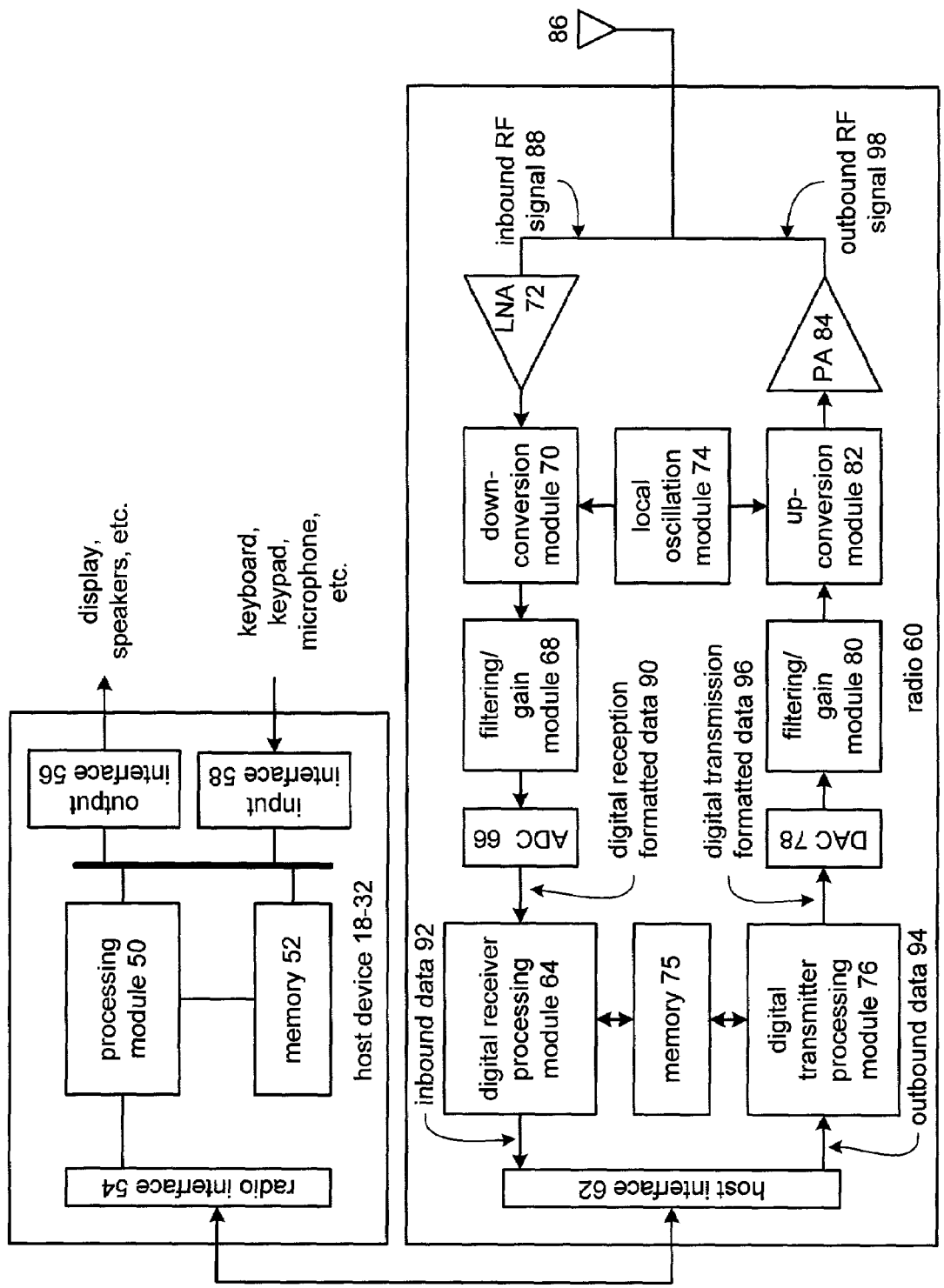
FIG. 2 illustrates a schematic block diagram of a wireless communication device in accordance with the present invention.

FIG. 2 illustrates a schematic block diagram of a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, analog-to-digital converter 66, filtering/gain module 68, down conversion module 70, low noise amplifier 72, local oscillation module 74, memory 75, digital transmitter processing module 76, digital-to-analog converter 78, filtering/gain module 80, up-conversion module 82, power amplifier 84, and an antenna 86. The antenna 86 may be a single antenna that is shared by the transmit and receive paths or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions corresponding to at least some of the functions illustrated in FIGS. 3–8.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The power amplifier 84, which may include the highly linear power amplifier discussed in FIG. 9 and/or the programmable power amplifier discussed in FIGS. 3–7, amplifies the RF signal to produce outbound RF signal 98. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the low noise amplifier 72, which amplifies the signal 88 to produce an amplified inbound RF signal. The low noise amplifier 72 provide the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

Figure 3:
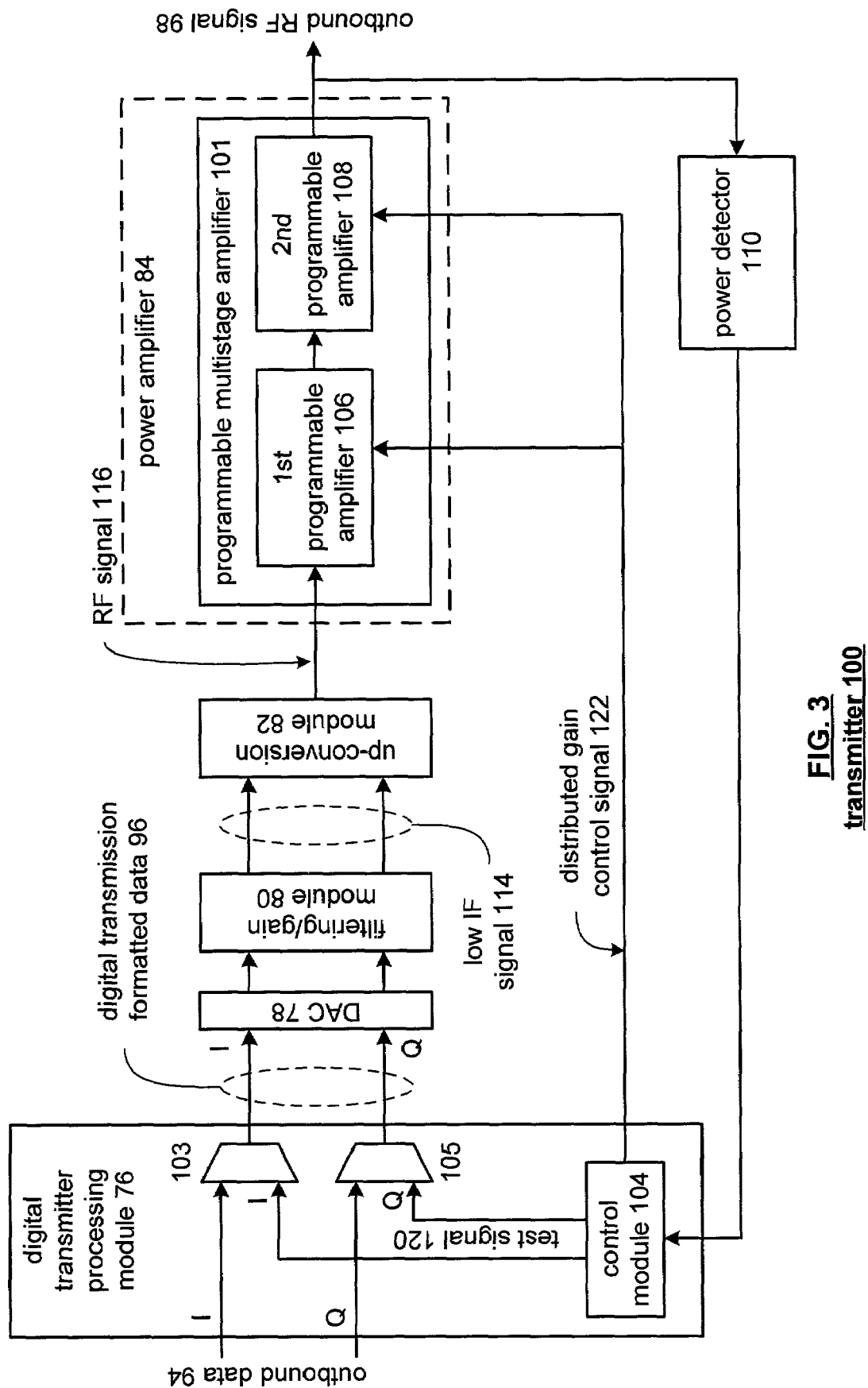
FIG. 3 illustrates a schematic block diagram of a transmitter in accordance with the present invention.

FIG. 3 illustrates a more detailed schematic block diagram of a transmitter 100 that may be used in radio 60. In this embodiment, the digital transmitter processing module 70 includes multiplexors 103 and 105 and control module 104. The power amplifier 84 is implemented utilizing a programmable multi-stage amplifier 101 that includes a $1^{st}$ programmable amplifier 106 and a $2^{nd}$ programmable amplifier 108. The transmitter 100 also includes a power detector 110 that determines the output power of the outbound RF signal 98 utilizing a transmitter signal strength indication and/or any other technique for determining output power levels of RF signals. As one of average skill in the art will appreciate, the programmable multi-stage amplifier 101 may include more than two programmable amplifiers.

During normal operation, the control module enables multiplexors 103 and 105 to pass the I and Q components of outbound data 94 to the digital-to-analog converter 78. The digital-to-analog converter 78 converts the I and Q components of the digital transmission formatted data 96 into corresponding analog signals. The filtering/gain module 80 converts the analog transmission formatted data into a low IF signal 114, which has an intermediate frequency ranging from zero Hertz to a few megahertz. The up-conversion module 82, based on a transmitter local oscillation provided by the local oscillator module 74, converts the low IF signal 114 into an RF signal 116.

The power amplifier 84, via the programmable multi-stage amplifier 101 amplifies the RF signal 116, based on a distributed gain control signal 122, to produce the outbound RF signal 98. The distributed gain control signal 122 provides a gain control signal to the $1^{st}$ programmable amplifier 106 and a gain control signal to the $2^{nd}$ programmable amplifier 108. Note that the $1^{st}$ and/or $2^{nd}$ programmable amplifiers 106 and/or 108 may be implemented in accordance with the highly linear power amplifier illustrated in FIG. 9.

To determine the distributed gain control signal 122, the control module 104 places the transmitter 100 in a test mode by enabling multiplexors 103 and 105 to respectively output an I and Q component of a test signal 120. During test mode, the digital-to-analog converter 78 converts the I and Q components of the test signal 120 into corresponding analog signals, which are subsequently filtered and/or gain adjusted by the filtering and gain module 80. The up-conversion module 82 converts the analog representation of the test signal 120 into a test RF signal based on the transmitter local oscillation. The power amplifier 84, via the programmable multi-stage amplifier 101 amplifies the RF test signal to produce an outbound RF test signal. The power detector 110 detects the power level of the outbound RF test signal and provides it back to the control module 104. Depending on what aspect the control module is currently testing (i.e., for noise level, linearity, or power levels), the control module determines whether the current setting for the gain of the $1^{st}$ programmable amplifier and $2^{nd}$ programmable amplifier 108 meets the desired limits. If so, the control module 104 switches back to normal operating mode by enabling the multiplexors 103 and 105 to pass the I and Q components of the outbound data 94.

If, however, the current gain settings for the $1^{st}$ and $2^{nd}$ programmable amplifiers 106 and 108 do not produce an output within the desired performance levels, the control module 104 changes the distributed gain control signal thus changing the gain of the $1^{st}$ and/or $2^{nd}$ programmable amplifiers. Having changed the gain, the control module 104 again provides test signal 120 to the transmitter and again determines its output power for this signal. This process continues until the outbound RF test signal is within the desired parameters.

Figure 4:
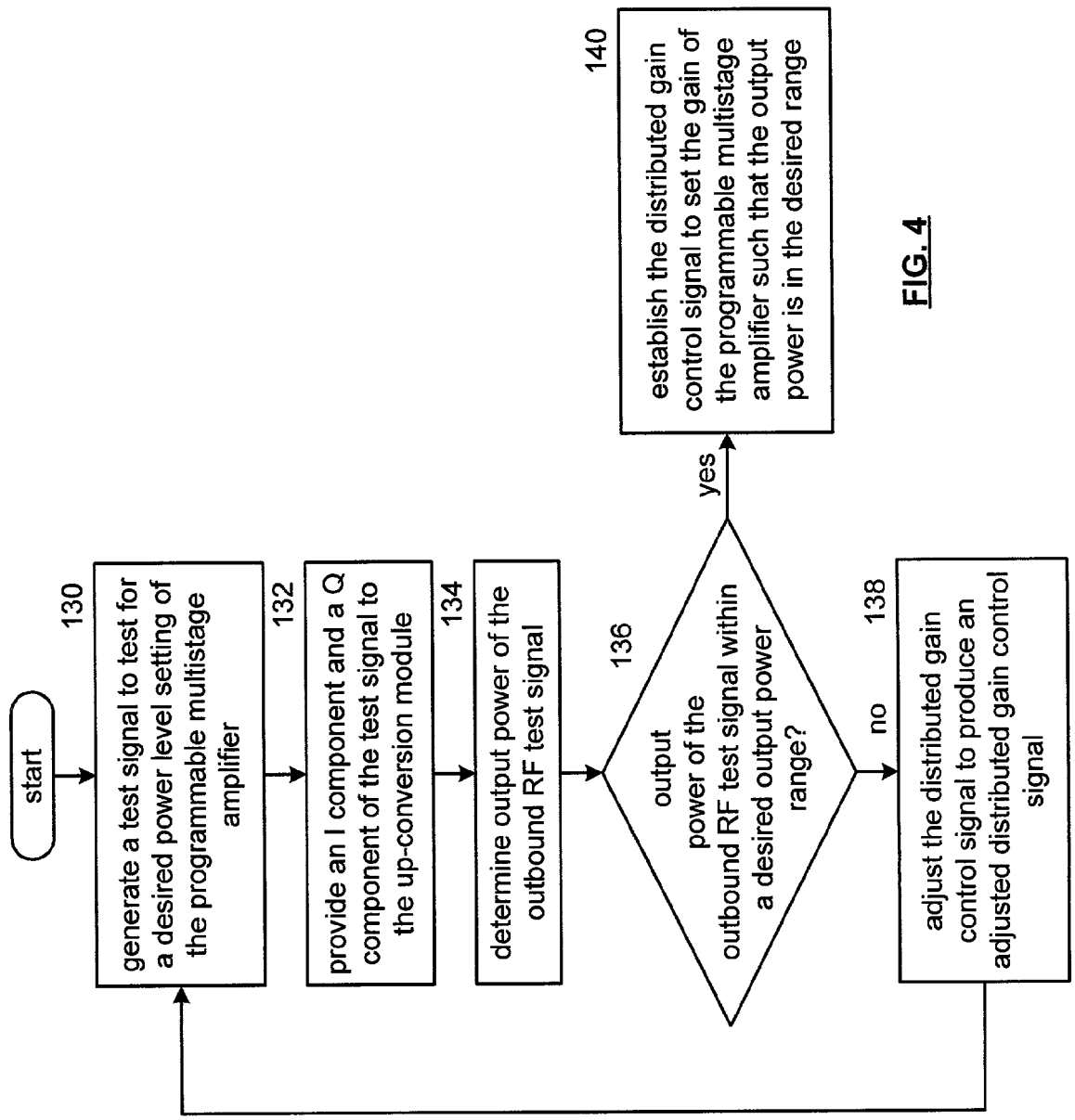
FIG. 4 illustrates a logic diagram of a method for determining gain of a programmable multi-stage amplifier based on a desired power level in accordance with the present invention.

FIG. 4 illustrates a logic diagram of a method for establishing a desired power level setting for the programmable multi-stage amplifier 101 which may be executed by control module 104. The process begins at Step 130 where the control module generates a test signal to test for a desired power level setting of the programmable multi-stage amplifier. The process then proceeds to Step 132 where the control module provides an I component and a Q component of the test signal to the up-conversion module. The up-conversion module produces an RF test signal that is amplified by the programmable multi-stage amplifier to produce an outbound RF test signal.

The process then proceeds to Step 134 where the control module determines output power of the outbound RF test signal. The process then proceeds to Step 136 where the control module determines whether the output power of the outbound RF test signal is within a desired output power range. For instance, depending on the mode of operation, the output power may be in a power conservation mode, sleep mode, or max power mode, and/or any other mode of operation that would affect the output level of the transmitter. If the output power is within the desired output range, the process proceeds to Step 140 where the distributed gain control signal is established to set the gain of the programmable multi-stage amplifier to maintain the output power in the desired range. In many instances, the gain will remain as set for the current test.

If, however, the output power of the outbound RF test signal is not within the desired output power range, the process proceeds to Step 138. At Step 138, the control module adjusts the distributed gain control signal (i.e., adjust the gain provided to the $1^{st}$ and/or $2^{nd}$ programmable amplifiers) to produce an adjusted distributed gain control signal. At this point, the process reverts back to Step 130 and repeats until the output power of the outbound RF test signal is within a desired output power range.

Figure 5:
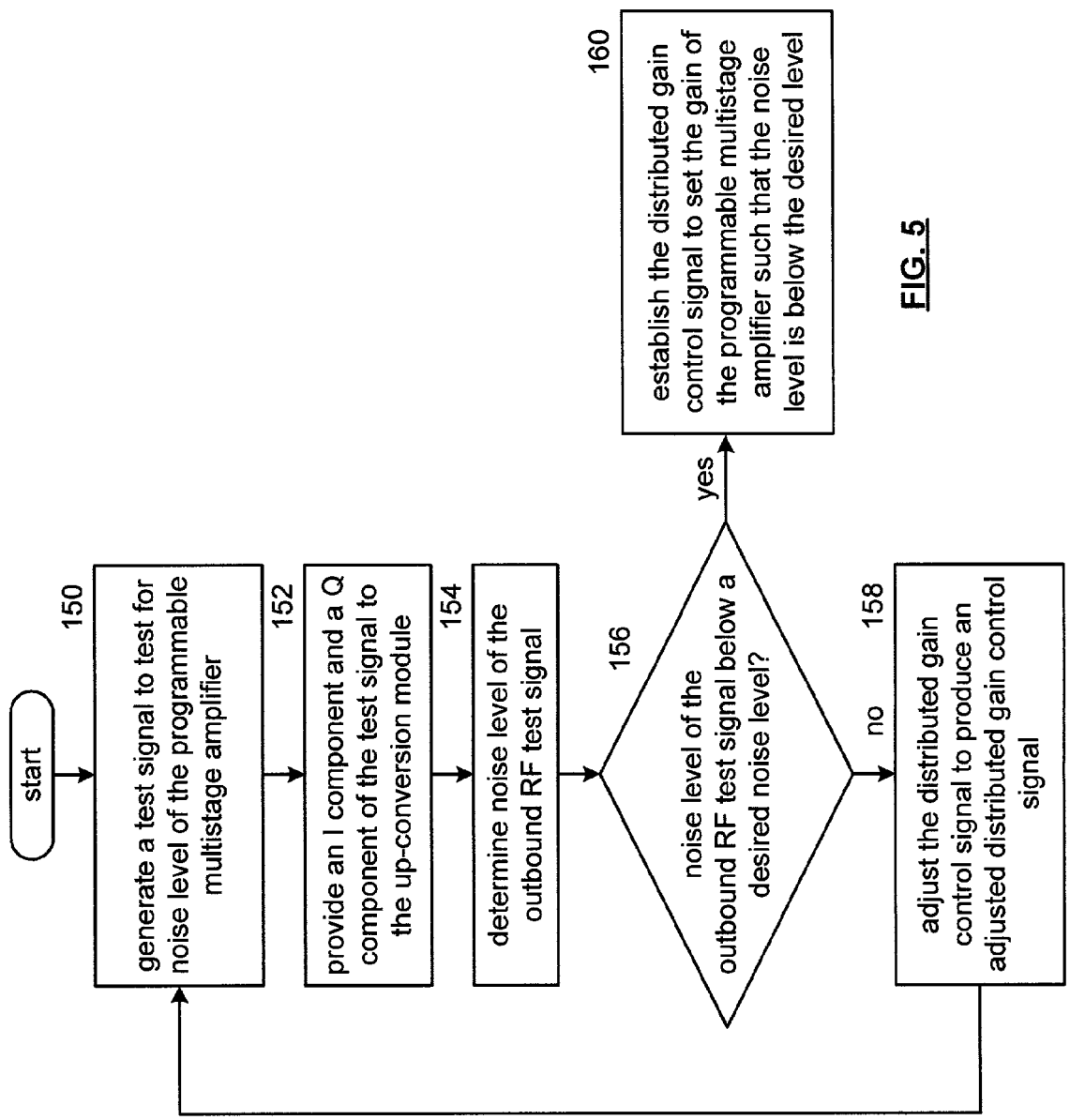
FIG. 5 illustrates a logic diagram of a method for determining gain of a programmable multi-stage amplifier based on a desired noise level in accordance with the present invention.

FIG. 5 illustrates a logic diagram of a method for determining noise level for the programmable multi-stage amplifier, which may be executed by control module 104. The process begins at Step 150 where the control module generates a test signal to test for noise level of the programmable multi-stage amplifier. The process then proceeds to Step 152 where the control module provides an I and Q component of the test signal to the up-conversion module. The up-conversion module converts the I and Q components of the test signal based on a local oscillation to produce an RF test signal. The programmable multi-stage amplifier amplifies the RF test signal to produce an outbound RF test signal.

The process then proceeds to Step 154 where the control module determines the noise level of the outbound RF test signal. The process then proceeds to Step 156 where the control module determines whether the noise level of the outbound RF test signal is below a desired noise level. If so, the process proceeds to Step 160 where the control module establishes the distributed gain control signal to set the gain of the programmable multi-stage amplifier such that the noise level is below the desired noise level.

If, however, the noise level of the outbound RF test signal is not below the desired noise level, the process proceeds to Step 158. At Step 158, the control level adjusts the distributed gain control signal (i.e., changes the gain control signal provided to the $1^{st}$ and/or $2^{nd}$ programmable amplifier) to produce an adjusted distributed gain control signal. The process then reverts back to Step 150 where the process repeats until the noise level of the outbound RF test signal is below a desired noise level. Note that the test signal may be a zero signal wherein all outputted signals is representative noise, the test signal may be a test signal having a fixed frequency and fixed amplitude such that any deviation therefrom is reflective of noise, and/or any other type of signal such that noise can be readily distinguished from the signal. As one of average skill in the art will appreciate, the noise level may be detected by a signal-to-noise ratio, and/or any other mechanism for measuring noise components of a signal.

Figure 6:
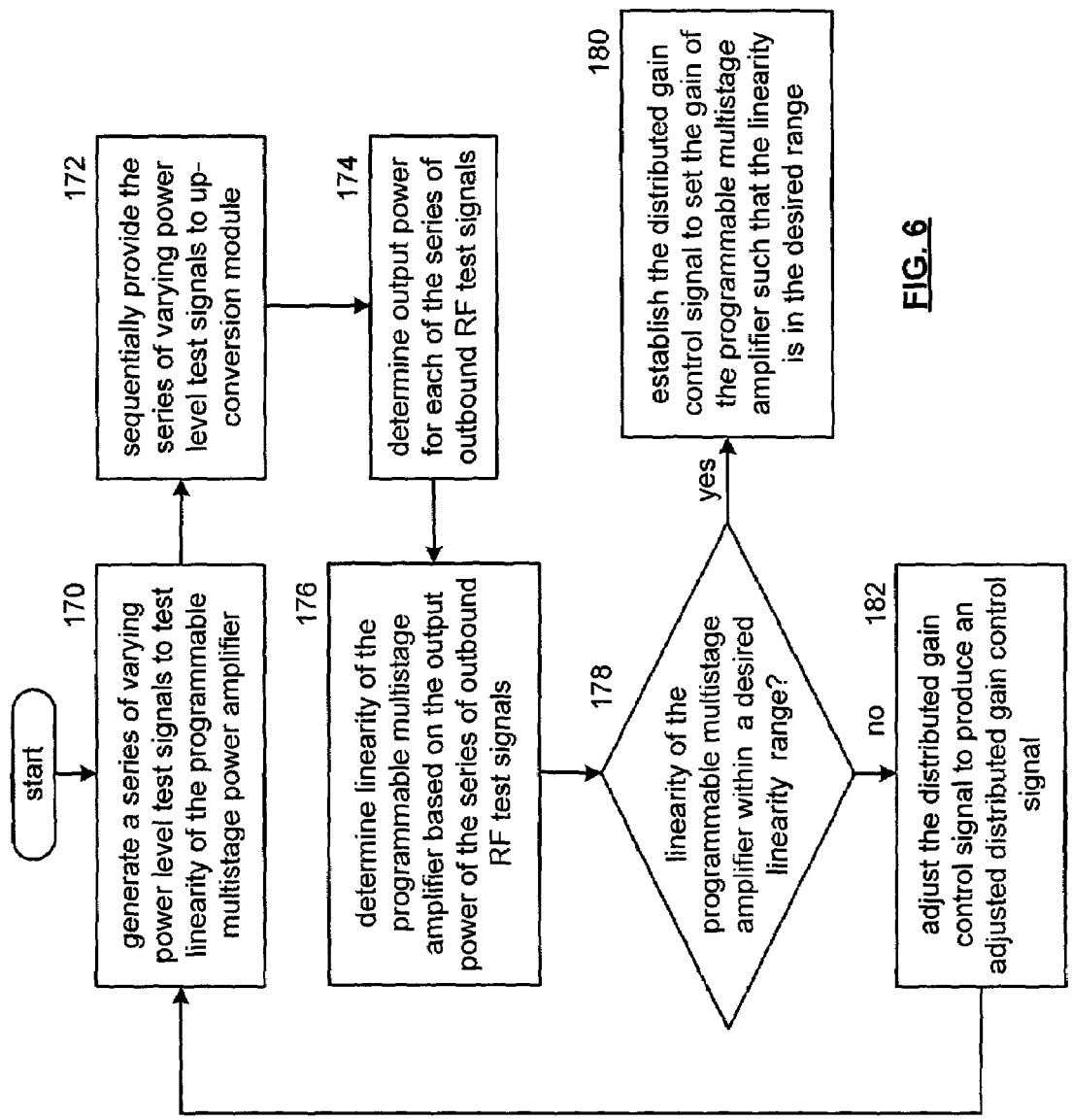
FIG. 6 illustrates a logic diagram of a method for determining gain based on linearity of a multi-stage power amplifier in accordance with the present invention.

FIG. 6 illustrates a logic diagram of a method that may be executed by the control module 104 to determine linearity of the programmable multi-stage amplifier. The process begins at Step 170 where the control module generates a series of varying power level test signals to test the linearity of the programmable multi-stage amplifier. The process then proceeds to Step 172 where the control module sequentially provides the series of varying power level test signals to the up-conversion module. The up-conversion module converts each of the test signals into RF test signals, which are subsequently amplified by the programmable multi-stage amplifier to produce a plurality of outbound RF test signals.

The process then proceeds to Step 174 where the control module determines output power for each of the series of outbound RF test signals. The process then proceeds to Step 176 where the control module determines linearity of the programmable multi-stage amplifier based on the output power of the series of output RF test signals. For instance, if the programmable multi-stage amplifier is linear, the ratio between the input power and output power for each of the test signals should be the same, within reasonable engineering tolerances.

The process then proceeds to Step 178 where the control module determines whether the linearity of the programmable multi-stage amplifier is within a desired linearity range. If so, the process proceeds to Step 180 where the control module establishes the distributed gain control signal to set the gain of the programmable multi-stage amplifier such that the linearity is within the desired range. Typically, this entails setting the gain for the $1^{st}$ and/or $2^{nd}$ programmable amplifiers at the gain used when the linearity was determined to be within the desired range.

If, however, the linearity of the programmable multi-stage amplifier is not within a desired linearity range, the process proceeds to Step 182. At Step 182, the control module adjusts the distributed gain control signal to produce an adjusted distributed gain control signal. As such, the control module is adjusting the gain of the $1^{st}$ and/or $2^{nd}$ programmable amplifier. At this point, the process repeats at Step 170 until the linearity of the programmable multi-stage amplifier is within the desired linearity range.

Figure 7:
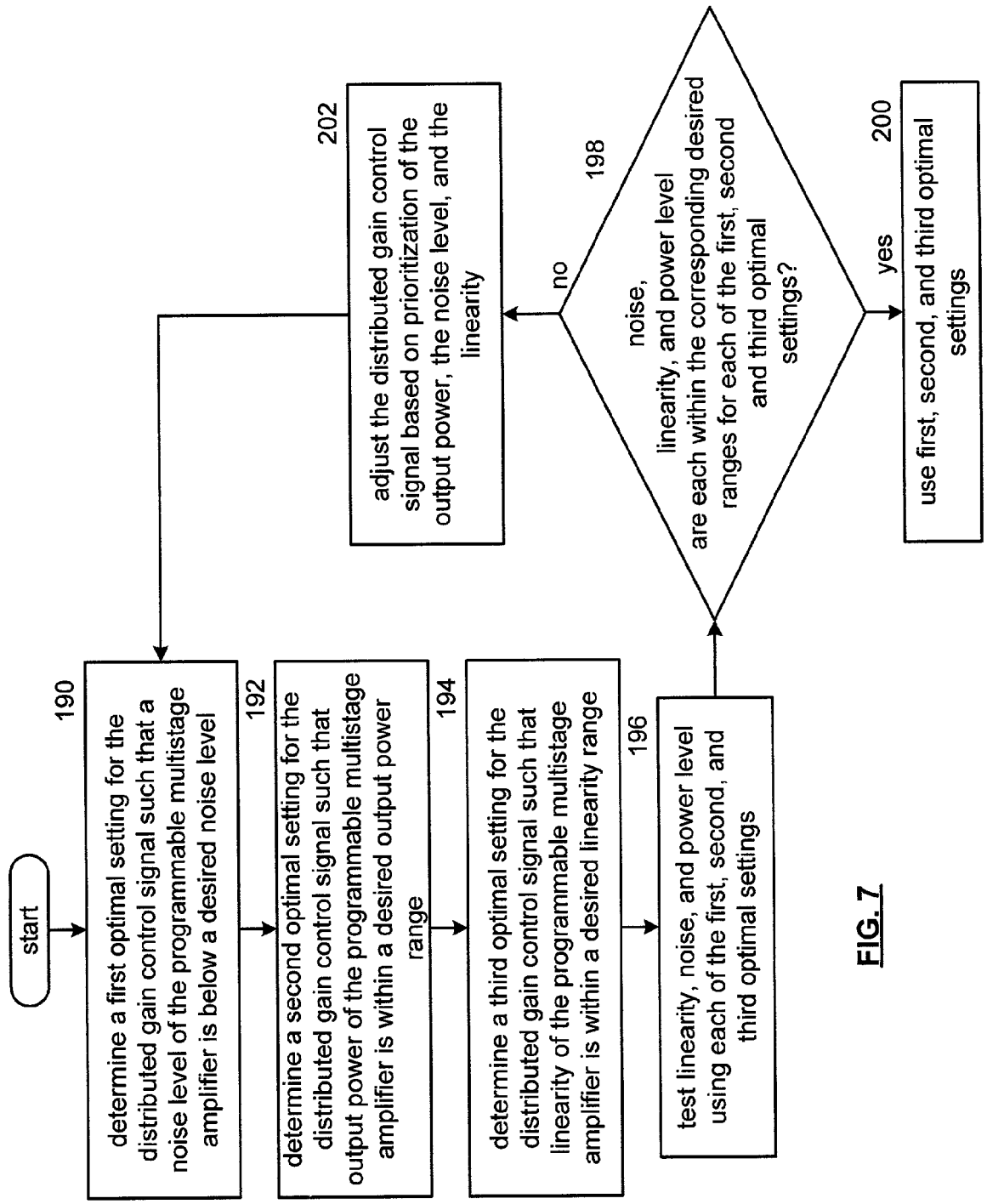
FIG. 7 illustrates a logic diagram of a method for balancing gain of a programmable multi-stage amplifier based on a desired noise level, desired output power and desired linearity in accordance with the present invention.

FIG. 7 illustrates a logic diagram of a method that may be implemented by the control module to balance the distributed gain setting signal for power levels, linearity and/or noise. The process begins at Step 90 where the control module determines a $1^{st}$ optimal setting or the distributed gain control signal such that the noise level of the programmable multi-stage amplifier is below the desired noise level. This may be done as discussed with reference to FIG. 5. The process then proceeds to Step 192 where the control module determines a $2^{nd}$ optimal setting for the distributed gain control signal such that the output power of the programmable multi-stage amplifier is within a desired output power range. This may be done in accordance with the process illustrated in FIG. 4. The process then proceeds to Step 194 where the control module determines a $3^{rd}$ optimal setting for the distributed gain control signal such that the linearity of the programmable multi-stage amplifier is within a desired linearity range. This may be done as described in FIG. 6.

The process then proceeds to Step 196 where the control module tests the linearity, noise, and power level using each of the $1^{st}$, $2^{nd}$ and $3^{rd}$ optimal settings. As such, the control module, utilizing the $1^{st}$ optimal setting, tests the linearity and power levels to determine whether they are within the respective ranges. Similarly, the control module uses the $2^{nd}$ optimal setting to determine whether the noise and linearity are at desired levels or within desired ranges. Also, the control module utilizing the $3^{rd}$ optimal setting to determine whether the power level and noise are within their respective ranges.

The process then proceeds to Step 198 where the control module determines whether, for any of the $1^{st}$, $2^{nd}$ or $3^{rd}$ optimal settings, the noise, the linearity and/or the power level is not within its desired range and/or level. If the noise, linearity and power level for all three optimal settings are within their respective ranges, the process proceeds to Step 200. At Step 200, the control module uses one, or more in combination, of the $1^{st}$, $2^{nd}$ or $3^{rd}$ optimal setting for the distributed gain control signal.

If, however, at Step 198, the response was negative, the process proceeds to Step 202. At Step 202, the control module adjusts the distributed gain control signal based on prioritization of output power, noise level or linearity. Such a prioritization would be based on the particular application and/or wireless communication standard being implemented by the radio. For example, noise and output power are of greater importance than linearity for a Bluetooth application. Conversely, linearity is a primary concern in an 802.11.a or .b application.

After adjusting the distributed gain control signal, the process reverts to Step 190. The processing continues until a distributed gain control signal can be determined which satisfies the desired noise level requirements, desired output level requirements and the desired linearity requirements. If such an optimal setting cannot be obtained, one or more of the desired output power, noise level or linearity is adjusted to reach a compromised setting.

Figure 8:
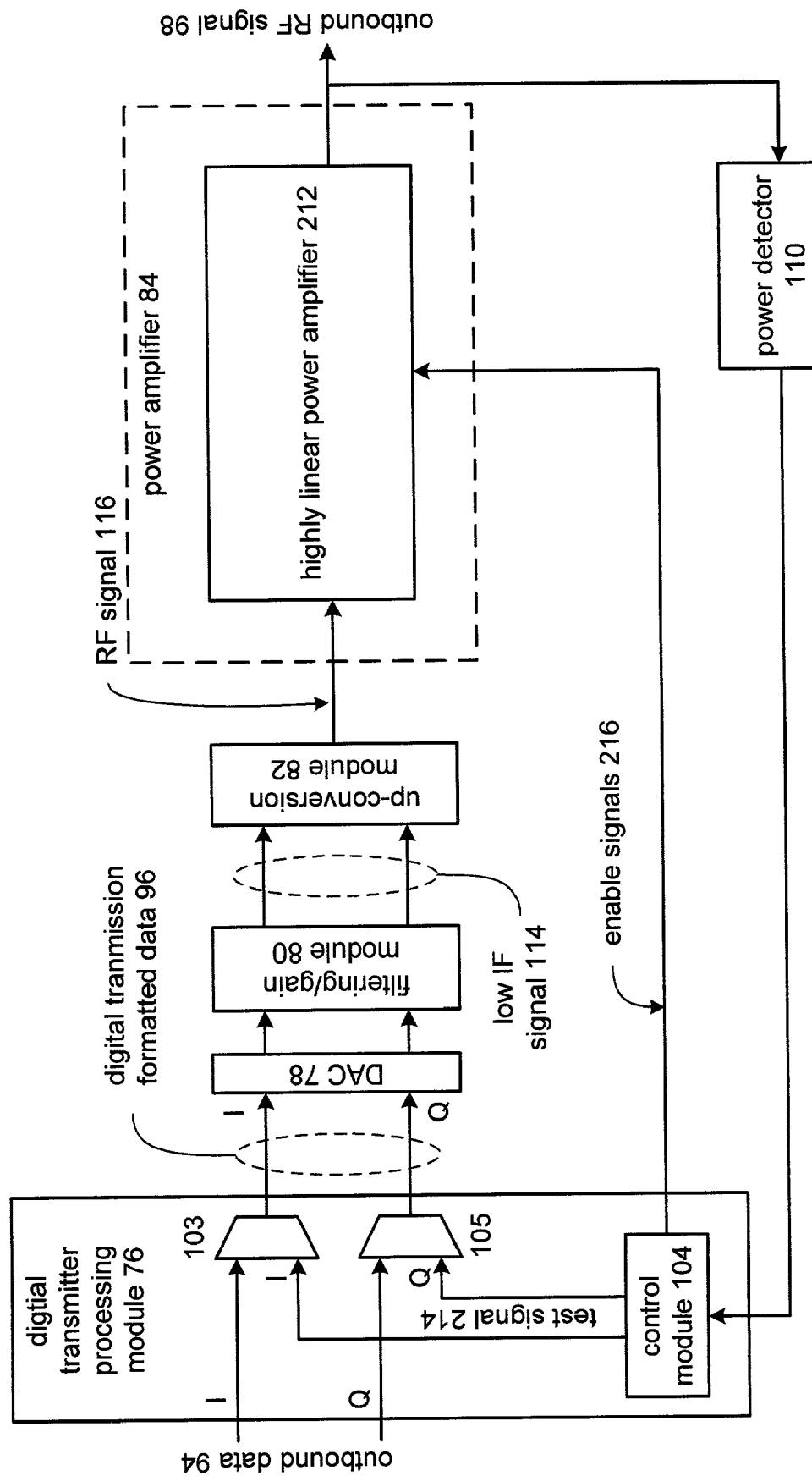
FIG. 8 illustrates a schematic block diagram of an alternate transmitter in accordance with the present invention.

FIG. 8 illustrates a schematic block diagram of an alternate transmitter 210 that may be utilized in radio 60. The transmitter 210 includes the digital transmitter processing module 76, the digital-to-analog converter 78, the filtering/gain module 80, up-conversion module 82, the power amplifier 84, and the power detector 110. The digital transmitter processing module 76 is configured to include control module 104 and multiplexors 103 and 105. The power amplifier 84 is implemented using highly linear power amplifier 212. The gain of the highly linear power amplifier 212 may be adjusted in accordance with enable signals 216 while having negligible effect on the linearity of power amplifier 212. The details of power amplifier 212 will be discussed in greater detail with reference to FIG. 9.

In operation, the control module 104 enables multiplexors 103 and 105 to output an I and Q component of outbound data 94 to the digital-to-analog converter 78. The digital-to-analog converter 78, filtering/gain module 80 and up-conversion module 82 perform as previously discussed. The highly linear power amplifier 212 amplifies the RF signal 116 at a particular gain setting, which is established via enable signals 216 to produce the outbound RF signal 98.

To determine the enable signals 216, and thus the particular gain setting for the highly linear power amplifier 212, the control module 104 provides a test signal 214 to the transmitter 210. To do this, the control module 104 enables multiplexors 103 and 105 to output an I and Q component of test signal 214. The test signal 214 propagates through the transmitter until an outbound RF test signal is produced. The power detector 110 detects the power level of this test signal and provides an indication back to control module 104. If the power level of the RF test signal is at a desired level, the control module 104 utilizes the current settings for enable signals 216.

If, however, the power level is not at the desired level, the control module 104 adjusts the enable signals to change the gain of the highly linear power amplifier 212. After making the gain adjustments, the control module 104 provides test signal 214 to transmitter 210. The test signal 214 is again propagated through transmitter 210 until its output power is detected via power detector 110. This process continues until the control module 104 determines that it has the proper settings for the gain of the highly linear power amplifier 212.

Figure 9:
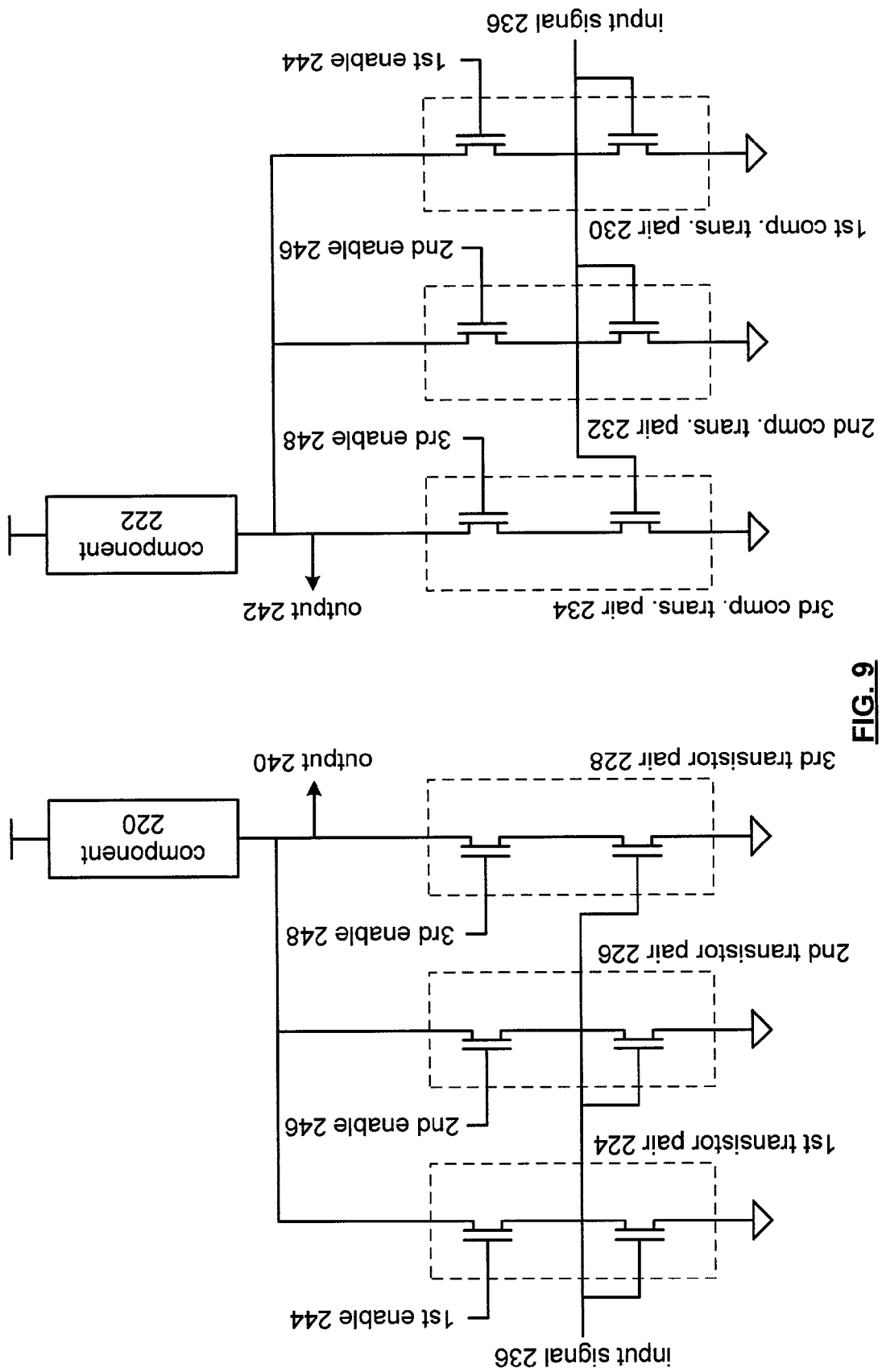
FIG. 9 illustrates a schematic block diagram of multi-embodiments of a highly linear power amplifier in accordance with the present invention.

FIG. 9 illustrates a schematic block diagram of the highly linear power amplifier 212. In this illustration, the highly linear power amplifier 212 is a differential implementation. For a single implemented implementation, the complimentary transistor pairs 230, 232 and 234 and component 222 would be omitted.

The highly linear power amplifier 212, in a differential mode, includes $1^{st}$ and $2^{nd}$ components 220 and 222, which may be resistors, inductors and/or linearly loaded transistors and may further include a capacitor in parallel, a plurality of transistor pairs 224–228 and a plurality of complimentary transistor pairs 230–234. Each of the transistor pairs includes an enable transistor and an input transistor. The input transistors for the $1^{st}$, $2^{nd}$ and $3^{rd}$ transistor pairs 224–226 are operably coupled to one leg of a differential input signal 236. The input transistors of the $1^{st}$, $2^{nd}$ and $3^{rd}$ complimentary transistor pairs 230–234 are operably coupled to another leg of differential input signal 236. The enable transistors for the $1^{st}$, $2^{nd}$ and $3^{rd}$ transistor pairs 224–228 are operably coupled to individual enable signals 244, 246 and 248. The enable transistors of the complimentary transistor pairs 230–234 are also individually coupled to the $1^{st}$, $2^{nd}$ and $3^{rd}$ enable signals 244–248.

By sizing the input transistors and corresponding enable transistors of the transistor pairs with a given ratio with respect to each other, the gain of the power amplifier 212 may be adjusted while having negligible effects on the linearity. For instance, by having the input transistor of the $1^{st}$ transistor pair being twice as big as the input transistor of the $2^{nd}$ transistor pair, the gain of the $1^{st}$ transistor pair will be twice that of the $2^{nd}$ transistor pair. Yet, by matching the input transistors and enable transistors from pair to pair, with only the size changing, the gain of the amplifier may be readily changed with negligible affects on the amplifier's linearity.

As one of average skill in the art will appreciate, the $1^{st}$, $2^{nd}$ and $3^{rd}$ enable signals may be enabled in any combination to produce a desired gain for the power amplifier. As one of average skill in the art will further appreciate, the gain is cumulative as transistors are enabled within the power amplifier 212. As one of average skill in the art will further appreciate, the linearity of the device remains relatively constant as the gain changes since the bias level for the input transistors of the transistor pairs is not varied.

The preceding discussion has presented a programmable multi-stage amplifier and a highly linear power amplifier that may be used in a transmitter of a radio. By providing programmability of such devices, the performance, cost and/or broadband applications of radios are enhanced. As one of average skill in the art will appreciate, the programmable multistage amplifier may be used in a variety of applications outside of radios, such as filters, speakers, etc. As one of average skill in the art will further appreciate, other embodiments may be derived from the teaching of the present invention, without deviating from the scope of the claims.

What is claimed is:

1. A transmitter having a programmable amplifier comprises:
    up-conversion module operably coupled to produce a radio frequency (RF) signal from an I component of a low intermediate frequency (IF) signal, Q component of the low IF signal, an I component of a local oscillation, and a Q component of a local oscillation;
    programmable multistage amplifier, which includes a first programmable amplifier and a second programmable amplifier, to receive the RF signal and produce an outbound RF signal, wherein the first programmable amplifier is operably coupled to produce an amplified RF signal by amplifying the RF signal in accordance with a first gain control signal of a distributed gain control signal and the second programmable amplifier is operably coupled to amplify the amplified RF signal from the first programmable amplifier in accordance with a second gain control signal of the distributed gain control signal; and
    control module operably coupled to generate the distributed gain control signal by generating test signals to determine gain settings for the first and second gain control signals to optimize a power level, to optimize a noise level and to optimize a linearity of the outbound RF signal from the multistage amplifier, the control module to then combine the optimized gain settings from the test signals to obtain an operating gain setting for the distributed gain control signal based on preference over one of power level, noise level and linearity of the outbound RF signal from the multistage amplifier.

2. The transmitter of claim 1, wherein the control module further comprises:
    processing module; and
    memory operably coupled to the processing module, wherein the memory includes operational instructions that cause the processing module to:
    generate a test signal to test for a desired power level setting of the programmable multistage amplifier;
    provide an I component and a Q component of the test signal to the up-conversion module, wherein the up-conversion module produces an RF test signal that is amplified by the programmable multistage amplifier to produce an outbound RF test signal;
    determine output power of the outbound RF test signal;
    determine whether the output power of the outbound RF test signal is within a desired output power range;
    when the output power of the outbound RF test signal is not within the desired output power range, adjust the distributed gain control signal to produce an adjusted distributed gain control signal; and
    repeat the providing the I and Q components of the test signal, the determining the output power of the outbound RF test signal with gain of the programmable multistage amplifier adjusted in accordance with the adjusted distributed gain control signal, the determining whether the output power is within the desired output power range, and the adjusting the distributed gain control signal until the output power is within the desired output power range.

3. The transmitter of claim 1, wherein the control module further comprises:
    processing module; and
    memory operably coupled to the processing module, wherein the memory includes operational instructions that cause the processing module to:
    generate a series of varying power level test signals to test linearity of the programmable multistage power amplifier;
    sequentially provide the series of varying power level test signals to up-conversion module, wherein the up-conversion module produces a series of RF test signals based on the series of varying power level test signals, wherein the programmable multistage amplifier amplifies the series of RF test signals to produce a series of outbound RF test signals;
    determine output power for each of the series of outbound RF test signals;
    determine linearity of the programmable multistage amplifier based on the output power of the series of outbound RF test signals;
    determine whether the linearity of the programmable multistage amplifier is within a desired linearity range;
    when the linearity of the programmable multistage amplifier is not within a desired linearity range, adjust the distributed gain control signal to produce an adjusted distributed gain control signal; and
    repeat the sequentially providing of the series of varying power level test signals to up-conversion module, the determining the output power for each of the series of outbound RF test signals with gain of the programmable multistage amplifier adjusted in accordance with the adjusted distributed gain control signal, the determining the linearity of the programmable multistage amplifier, the determining whether the linearity of the programmable multistage amplifier is within a desired linearity range, and the adjusting the distributed gain control signal until the linearity is within the desired linearity range.

4. The transmitter of claim 1, wherein the control module further comprises:
    processing module; and
    memory operably coupled to the processing module, wherein the memory includes operational instructions that cause the processing module to:

generate a test signal to test for noise level of the programmable multistage amplifier;

provide an I component and a Q component of the test signal to the up-conversion module, wherein the up-conversion module produces an RF test signal that is amplified by the programmable multistage amplifier to produce an outbound RF test signal;

determine noise level of the outbound RF test signal;

determine whether the noise level of the outbound RF test signal is below a desired noise level;

when the noise level of the outbound RF test signal is not below the desired noise, adjust the distributed gain control signal to produce an adjusted distributed gain control signal; and repeat the providing the I and Q components of the test signal, the determining the noise level of the outbound RF test signal with gain of the programmable multistage amplifier adjusted in accordance with the adjusted distributed gain control signal, the determining whether the noise level is below the desired noise level, and the adjusting the distributed gain control signal until the noise level is below the desired noise level.

5. The transmitter of claim 4, wherein the test signal further comprises one of:

a null signal; and a signal having a known power level, wherein the determining the noise level is based on a determined signal to noise ratio.

6. The transmitter of claim 1, wherein the control module further comprises:

processing module; and memory operably coupled to the processing module, wherein the memory includes operational instructions that cause the processing module to:

determine a first optimal setting for the distributed gain control signal such that a noise level of the programmable multistage amplifier is below a desired noise level;

determine a second optimal setting for the distributed gain control signal such that output power of the programmable multistage amplifier is within a desired output power range;

determine a third optimal setting for the distributed gain control signal such that linearity of the programmable multistage amplifier is within a desired linearity range;

determine whether the linearity of the programmable multistage amplifier is within the desired linearity range, the output power of the programmable multistage amplifier is within the desired output power range, and the noise level of the multistage amplifier is below the desired noise level for each of the first, second, and third optimal settings for the distributed gain control signal; and when one or more of the linearity, the output power, and the noise level of the multistage programmable amplifier is not within the desired linearity range, the desired output power range, and below the desired noise level, respectively, for one or more of the first, second, and third optimal settings, adjust the distributed gain control signal based on prioritization of the output power, the noise level, and the linearity.

7. A radio comprises:

receiver operably coupled to convert an inbound RF signal into an I component of an inbound low intermediate frequency (IF) signal and a Q component of the low IF signal based on an I component of a receiver local oscillation and a Q component of the receiver local oscillation; and transmitter that includes:

up-conversion module operably coupled to produce a radio frequency (RF) signal from an I component of a low intermediate frequency (IF) signal, Q component of the low IF signal, an I component of a local oscillation, and a Q component of a local oscillation;

programmable multistage amplifier, which includes a first programmable amplifier and a second programmable amplifier, to receive the RF signal and produce an outbound RF signal, wherein the first programmable amplifier is operably coupled to produce an amplified RF signal by amplifying the RF signal in accordance with a first gain control signal of a distributed gain control signal and the second programmable amplifier is operably coupled to amplify the amplified RF signal from the first programmable amplifier in accordance with a second gain control signal of the distributed gain control signal; and control module operably coupled to generate the distributed gain control signal by generating test signals to determine gain settings for the first and second gain control signals to optimize a power level, to optimize a noise level and to optimize a linearity of the outbound RF signal from the multistage amplifier, the control module to then combine the optimized gain settings from the test signals to obtain an operating gain setting for the distributed gain control signal based on preference over one of power level, noise level and linearity of the outbound RF signal from the multistage amplifier.

8. The radio of claim 7, wherein the control module further comprises:

processing module; and memory operably coupled to the processing module, wherein the memory includes operational instructions that cause the processing module to:

generate a test signal to test for a desired power level setting of the programmable multistage amplifier;

provide an I component and a Q component of the test signal to the up-conversion module, wherein the up-conversion module produces an RF test signal that is amplified by the programmable multistage amplifier to produce an outbound RF test signal;

determine output power of the outbound RF test signal;

determine whether the output power of the outbound RF test signal is within a desired output power range;

when the output power of the outbound RF test signal is not within the desired output power range, adjust the distributed gain control signal to produce an adjusted distributed gain control signal; and repeat the providing the I and Q components of the test signal, the determining the output power of the outbound RF test signal with gain of the programmable multistage amplifier adjusted in accordance with the adjusted distributed gain control signal, the determining whether the output power is within the desired output power range, and the adjusting the distributed gain control signal until the output power is within the desired output power range.

9. The radio of claim 7, wherein the control module further comprises:

processing module; and memory operably coupled to the processing module, wherein the memory includes operational instructions that cause the processing module to:

generate a series of varying power level test signals to test linearity of the programmable multistage power amplifier;

sequentially provide the series of varying power level test signals to up-conversion module, wherein the up-conversion module produces a series of RF test signals based on the series of varying power level test signals, wherein the programmable multistage amplifier amplifies the series of RF test signals to produce a series of outbound RF test signals;

determine output power for each of the series of outbound RF test signals;

determine linearity of the programmable multistage amplifier based on the output power of the series of outbound RF test signals;

determine whether the linearity of the programmable multistage amplifier is within a desired linearity range;

when the linearity of the programmable multistage amplifier is not within a desired linearity range, adjust the distributed gain control signal to produce an adjusted distributed gain control signal; and repeat the sequentially providing of the series of varying power level test signals to up-conversion module, the determining the output power for each of the series of outbound RF test signals with gain of the programmable multistage amplifier adjusted in accordance with the adjusted distributed gain control signal, the determining the linearity of the programmable multistage amplifier, the determining whether the linearity of the programmable multistage amplifier is within a desired linearity range, and the adjusting the distributed gain control signal until the linearity is within the desired linearity range.

10. The radio of claim 7, wherein the control module further comprises:

processing module; and memory operably coupled to the processing module, wherein the memory includes operational instructions that cause the processing module to:

generate a test signal to test for noise level of the programmable multistage amplifier;

provide an I component and a Q component of the test signal to the up-conversion module, wherein the up-conversion module produces an RF test signal that is amplified by the programmable multistage amplifier to produce an outbound RF test signal;

determine noise level of the outbound RF test signal;

determine whether the noise level of the outbound RF test signal is below a desired noise level;

when the noise level of the outbound RF test signal is not below the desired noise, adjust the distributed gain control signal to produce an adjusted distributed gain control signal; and repeat the providing the I and Q components of the test signal, the determining the noise level of the outbound RF test signal with gain of the programmable multistage amplifier adjusted in accordance with the adjusted distributed gain control signal, the determining whether the noise level is below the desired noise level, and the adjusting the distributed gain control signal until the noise level is below the desired noise level.

11. The radio of claim 10, wherein the test signal further comprises one of:

a null signal; and a signal having a known power level, wherein the determining the noise level is based on a determined signal to noise ratio.

12. The radio of claim 7, wherein the control module further comprises:

processing module; and memory operably coupled to the processing module, wherein the memory includes operational instructions that cause the processing module to:

determine a first optimal setting for the distributed gain control signal such that a noise level of the programmable multistage amplifier is below a desired noise level;

determine a second optimal setting for the distributed gain control signal such that output power of the programmable multistage amplifier is within a desired output power range;

determine a third optimal setting for the distributed gain control signal such that linearity of the programmable multistage amplifier is within a desired linearity range;

determine whether the linearity of the programmable multistage amplifier is within the desired linearity range, the output power of the programmable multistage amplifier is within the desired output power range, and the noise level of the multistage amplifier is below the desired noise level for each of the first, second, and third optimal settings for the distributed gain control signal; and when one or more of the linearity, the output power, and the noise level of the multistage programmable amplifier is not within the desired linearity range, the desired output power range, and below the desired noise level, respectively, for one or more of the first, second, and third optimal settings, adjust the distributed gain control signal based on prioritization of the output power, the noise level, and the linearity.

13. A programmable multistage amplifier comprises:

first programmable amplifier operably coupled to produce an amplified signal by amplifying an input radio frequency (RF) signal in accordance with a first gain control signal;

second programmable amplifier operably coupled to the first programmable amplifier to produce an outbound RF signal by amplifying the amplified signal from the first programmable amplifier in accordance with a second gain control signal; and control module operably coupled to generate the first and second gain control signals by generating test signals to determine gain settings for the first and second gain control signals to optimize a power level, to optimize a noise level and to optimize a linearity of the outbound RF signal, the control module to then combine the optimized gain settings from the test signals to obtain an operating gain setting for the first and second gain control signal based on preference over one of power level, noise level and linearity of the outbound RF signal.

14. The programmable multistage amplifier of claim 13, wherein the control module further comprises:

processing module; and memory operably coupled to the processing module, wherein the memory includes operational instructions that cause the processing module to:

generate a test signal to test for a desired power level setting of the programmable multistage amplifier;

provide the test signal to the first programmable amplifier such that the first and second programmable amplifiers amplify the test signal to produce an outbound test signal;

determine output power of the outbound test signal;

determine whether the output power of the outbound test signal is within a desired output power range;

when the output power of the outbound test signal is not within the desired output power range, adjust at least one of the first and second gain control signals to produce at least one adjusted gain control signal; and repeat the providing of the test signal, the determining the output power of the outbound test signal with gain of the programmable multistage amplifier adjusted in accordance with the at least one adjusted gain control signal, the determining whether the output power is within the desired output power range, and the adjusting of the at least one of the first and second gain control signals until the output power is within the desired output power range.

15. The programmable multistage amplifier of claim 13, wherein the control module further comprises:

processing module; and memory operably coupled to the processing module, wherein the memory includes operational instructions that cause the processing module to:

generate a series of varying power level test signals to test linearity of the programmable multistage amplifier;

sequentially provide the series of varying power level test signals to first programmable amplifier such that the first and second programmable amplifiers amplify the series of test signals to produce a series of outbound test signals;

determine output power for each of the series of outbound test signals; determine linearity of the programmable multistage amplifier based on the output power of the series of outbound test signals;

determine whether the linearity of the programmable multistage amplifier is within a desired linearity range;

when the linearity of the programmable multistage amplifier is not within a desired linearity range, adjust at least one of the first and second gain control signals to produce at least one adjusted gain control signal; and repeat the sequentially providing of the series of varying power level test signals to first programmable amplifier, the determining the output power for each of the series of outbound test signals with gain of the programmable multistage amplifier adjusted in accordance with the at lest one adjusted gain control signal, the determining the linearity of the programmable multistage amplifier, the determining whether the linearity of the programmable multistage amplifier is within a desired linearity range, and the adjusting of the at least one of the first and second gain control signals until the linearity is within the desired linearity range.

16. The programmable multistage amplifier of claim 13, wherein the control module further comprises:

processing module; and memory operably coupled to the processing module, wherein the memory includes operational instructions that cause the processing module to:

generate a test signal to test for noise level of the programmable multistage amplifier;

provide the test signal to the first programmable amplifier such the programmable multistage amplifier produces an outbound test signal;

determine noise level of the outbound test signal;

determine whether the noise level of the outbound test signal is below a desired noise level;

when the noise level of the outbound test signal is not below the desired noise, adjust at least one of the first and second gain control signals to produce at least one adjusted gain control signal; and repeat the providing of the test signal, the determining the noise level of the outbound test signal with gain of the programmable multistage amplifier adjusted in accordance with the at least one adjusted gain control signal, the determining whether the noise level is below the desired noise level, and the adjusting the at least one of the first and second gain control signals until the noise level is below the desired noise level.

17. The programmable multistage amplifier of claim 16, wherein the test signal further comprises one of:

a null signal; and a signal having a known power level, wherein the determining the noise level is based on a determined signal to noise ratio.

18. The programmable multistage amplifier of claim 13, wherein the control module further comprises:

processing module; and memory operably coupled to the processing module, wherein the memory includes operational instructions that cause the processing module to:

determine a first optimal setting for the first and second gain control signals such that a noise level of the programmable multistage amplifier is below a desired noise level;

determine a second optimal setting for the first and second gain control signals such that output power of the programmable multistage amplifier is within a desired output power range;

determine a third optimal setting for the first and second gain control signals such that linearity of the programmable multistage amplifier is within a desired linearity range;

determine whether the linearity of the programmable multistage amplifier is within the desired linearity range, the output power of the programmable multistage amplifier is within the desired output power range, and the noise level of the multistage amplifier is below the desired noise level for each of the first, second, and third optimal settings for the distributed gain control signal; and when one or more of the linearity, the output power, and the noise level of the multistage programmable amplifier is not within the desired linearity range, the desired output power range, and below the desired noise level, respectively, for one or more of the first, second, and third optimal settings, adjust at least one of the first and second gain control signals based on prioritization of the output power, the noise level, and the linearity.

* * * * *